(12) United States Patent  
Nodake

(10) Patent No.: US 7,298,208 B2
(45) Date of Patent: Nov. 20, 2007

(54) AUTOMATIC LEVEL CONTROL CIRCUIT WITH IMPROVED RECOVERY ACTION

(75) Inventor: Yasuhiro Nodake, Ora-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 152 days.

(21) Appl. No.: 11/187,185

(22) Filed: Jul. 22, 2005

(65) Prior Publication Data

US 2006/0017501 A1    Jan. 26, 2006

(30) Foreign Application Priority Data

Jul. 23, 2004   (JP) .............................. 2004-216234

(51) Int. Cl.
*H03G 3/20* (2006.01)

(52) U.S. Cl. ...................... 330/141; 330/279

(58) Field of Classification Search ................ 330/129, 330/141, 279, 281; 455/232.1, 234.1, 245.1

See application file for complete search history.

(56) References Cited

U.S. PATENT DOCUMENTS 5,423,081 A * 6/1995 Thiele et al. ................ 330/279
6,670,849 B1  12/2003 Damgaard et al.
7,164,315 B2 * 1/2007 Camnitz et al. ............ 330/129

FOREIGN PATENT DOCUMENTS

JP        11-328855        11/1999

OTHER PUBLICATIONS

English Patent Abstract of JP11328855 from esp@cenet, published Nov. 30, 1999, 1 page.
U.S. Office Action issued in U.S. Appl. No. 11/187,281 mailed on Feb. 21, 2007, 7 pages.

* cited by examiner

*Primary Examiner*—Khanh Van Nguyen
(74) *Attorney, Agent, or Firm*—Osha Liang LLP

(57) ABSTRACT

An automatic level control circuit comprises a level detection circuit which detects attack detection to sense a detection level greater than a predetermined level and recovery detection to sense a detection level smaller than the predetermined level, and a gain control circuit which outputs a gain adjustment control signal to regulate a gain of an variable gain amplifier such that an output signal from the variable gain amplifier is set to a predetermined signal level. The gain control circuit generates multiple candidate signals to change the gain at different response speeds, and selectively outputs, as a gain adjustment control signal, one of the candidate signals capable of providing the smallest value as the gain. Therefore, even when the gain is rapidly reduced by the attack action against a short-duration large signal, the gain can be returned to its original state at an appropriate speed.

10 Claims, 7 Drawing Sheets

AUTOMATIC LEVEL CONTROL CIRCUIT WITH IMPROVED RECOVERY ACTION

CROSS REFERENCE TO RELATED APPLICATIONS

The entire disclosure of Japanese Patent Application No. 2004-216234 including the specification, claims, drawings and abstract is incorporated herein by reference.

This application contains subject matter that may be related to that contained in the following U.S. application Ser. No. 11/187,281 filed on Jul. 22, 2005, and assigned to the assignee of the instant application: "Automatic Level Control Circuit With Improved Attack Action".

BACKGROUND OF THE INVENTION

1. Field of the Invention

The present invention relates to an ALC (Automatic Level Control) circuit for automatically adjusting the gain of an amplifier to establish an output signal level from the amplifier at a predetermined level.

2. Description of the Related Art

Many electronic cameras, such as a digital camera, a digital video camera, or the like, have a sound recording capability to record audio input through a microphone and a moving image recording capability to record moving images. Such an electronic camera having a sound recording capability generally includes a circuit for automatically adjusting the gain of an amplifier installed in a stage prior to a recording stage in accordance with a level of an input audio signal when the sound is recorded.

FIG. 1 shows an automatic level control circuit in a digital detection system using a programmable gain amplifier. In the automatic level control circuit of FIG. 1, an input audio signal amplified by a programmable gain amplifier 10 is converted from an analog signal into a digital signal by an analog/digital converter (an A/D converter) 20 installed in a stage after the programmable gain amplifier 10. Next, the level of the digital signal (an output signal level from the programmable gain amplifier 10) is detected by a level detector 30 and then compared with a predetermined reference level. Based on the obtained comparison result, the gain of the programmable gain amplifier 10 is adjusted according to a control signal output from a gain controller 40 to the programmable gain amplifier 10 such that the output audio signal from the programmable gain amplifier 10 (i.e. the input audio signal having been amplified by the programmable gain amplifier 10) is set to a predetermined audio signal level.

More specifically, when the level of the digital signal detected by the level detector 30 is greater than the predetermined reference level, an operation for stepping down the gain of the programmable gain amplifier 10 by one step (an attack action) is performed, whereas an operation for stepping up the gain of the programmable gain amplifier 10 by one step (a recovery action) is performed when the level of the digital output signal is smaller than the predetermined reference level. By repeating such adjustment to the gain achieved by the attack and recovery actions until the level of the digital signal reaches the predetermined reference level, the amplifier gain can be automatically controlled in accordance with the level of the input audio signal at the predetermined reference level, which enables the recording of audio input at a desired audio signal level.

The attack action performed in the automatic level control circuit is generally completed in a short time to minimize an adverse effect that an audio waveform loses its accurate shape due to an excessively large signal beyond a dynamic range. In contrast to this, the recovery action is completed over a relatively long time to prevent data concerning the sound intensity from being lost.

However, when a short-duration large signal, such as a signal of the sound of a window pane breaking, is sporadically input, problems as described below are introduced. With such a short duration signal, there is no necessity to maintain the amplifier gain in a reduced state, in contrast to a situation where a large signal continues for a significant amount of time. Accordingly, after the amplifier gain is rapidly reduced by the attack action invoked by the input of the short-duration large signal, it is necessary to restore the amplifier gain to its original state as quickly as possible. However, because in related art the recovery action is normally performed over a long time, amplifier gain which has been rapidly reduced is not promptly restored to the original state. As a result, an insufficient sound level continues for a certain time period until the time when the rapidly reduced amplifier gain is restored to the original state by the recovery action.

Although, in consideration of such insufficiency of the sound level, the operation time of the recovery action can be shortened, shortening the operation time of the recovery action results in a problematic deterioration in characteristics of a voice signal, including loss of the data on sound intensity, frequent occurrence of distortion in an audio waveform caused by frequent attack actions due to intermittent input of the large signal, and the like.

SUMMARY OF THE INVENTION

The present invention advantageously provides an automatic level control circuit comprising a level detection circuit which detects a level of an output signal from a variable gain amplifier for attack detection to sense a detection level being at a predetermined level or higher and recovery detection to sense the detection level being at the predetermined level or lower, and a gain control circuit which outputs, based on a detection result obtained by the level detection circuit, a gain adjustment control signal to regulate a gain of the variable gain amplifier such that the output signal from the variable gain amplifier is set to a predetermined signal level. The gain control circuit generates a plurality of candidate signals to change the gain at different response speeds, and selectively outputs, as a gain adjustment control signal, one of the candidate signals capable of providing a smallest value for the gain.

BRIEF DESCRIPTION OF THE DRAWINGS

Preferred embodiments of the present invention will be described in detail based on the following figures, wherein.

DESCRIPTION OF THE PREFERRED EMBODIMENTS

Figure 1:
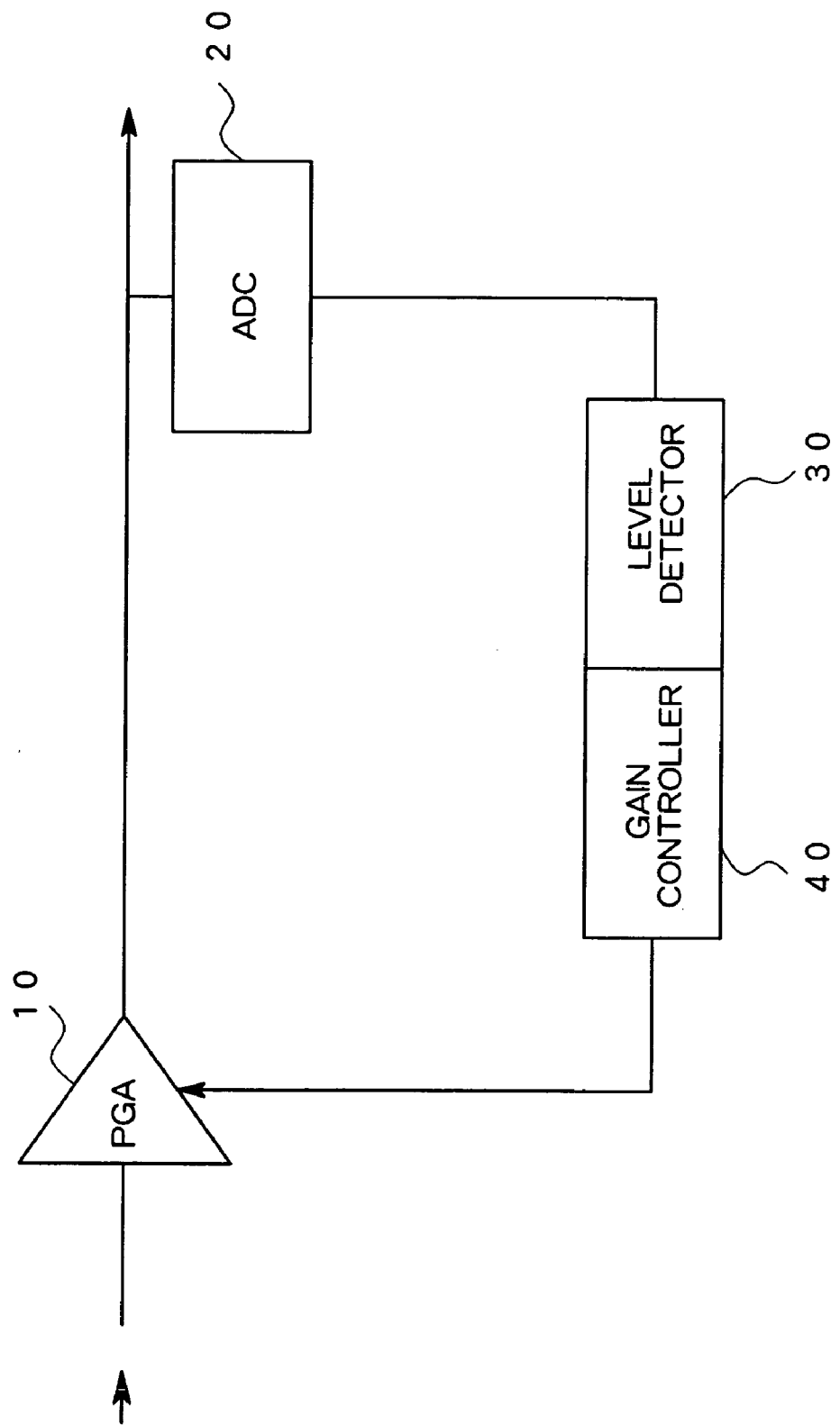
FIG. 1 is a circuit diagram of an automatic level control circuit in a digital detection system using a programmable gain amplifier according to a first embodiment of the present invention.

Referring now to the drawings, a first embodiment of the present invention will be described below.

Figure 2:
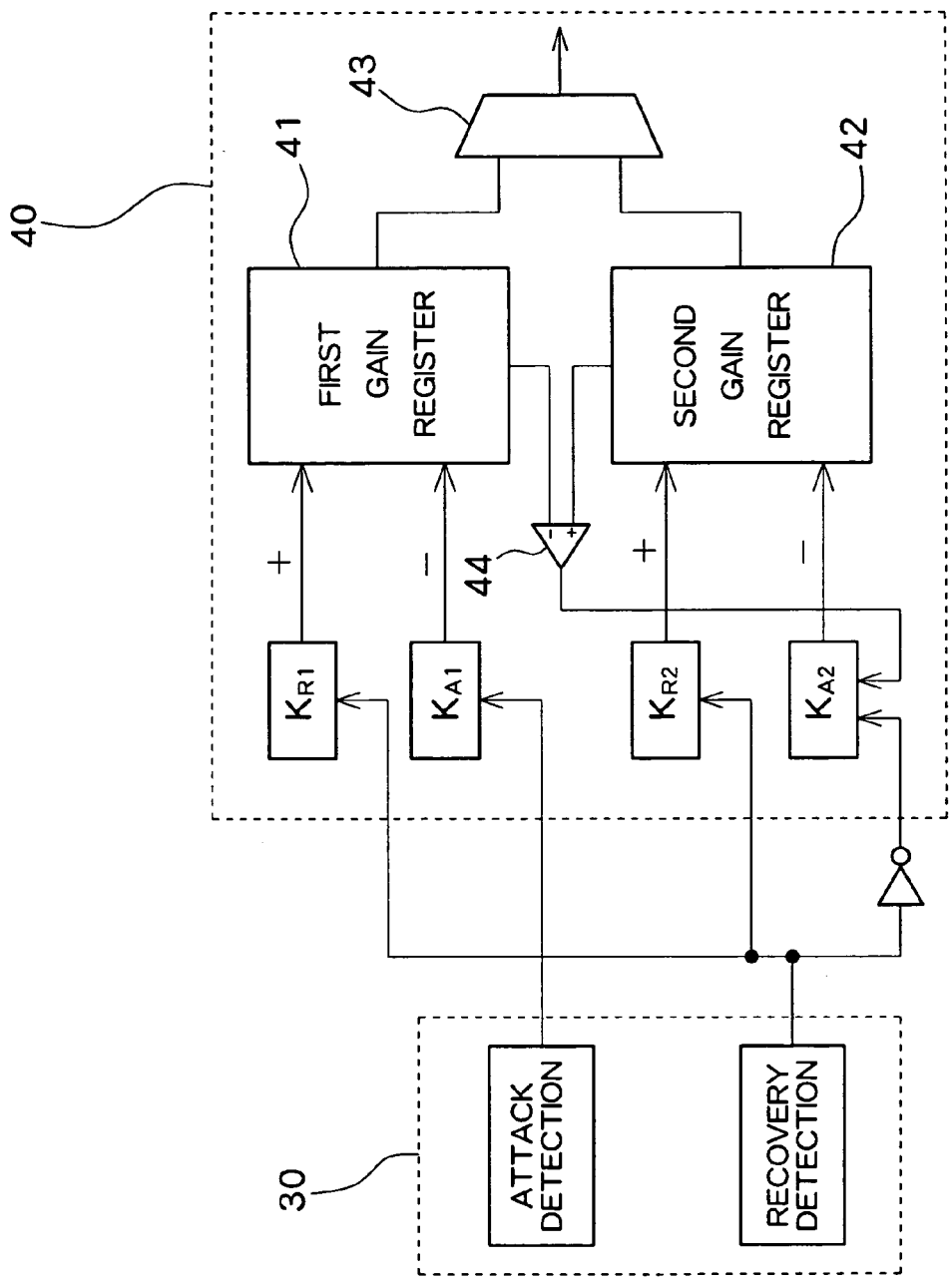
FIG. 2 is a schematic diagram showing a configuration of a level detector and a gain controller in the automatic level control circuit of FIG. 1.
Figure 3:
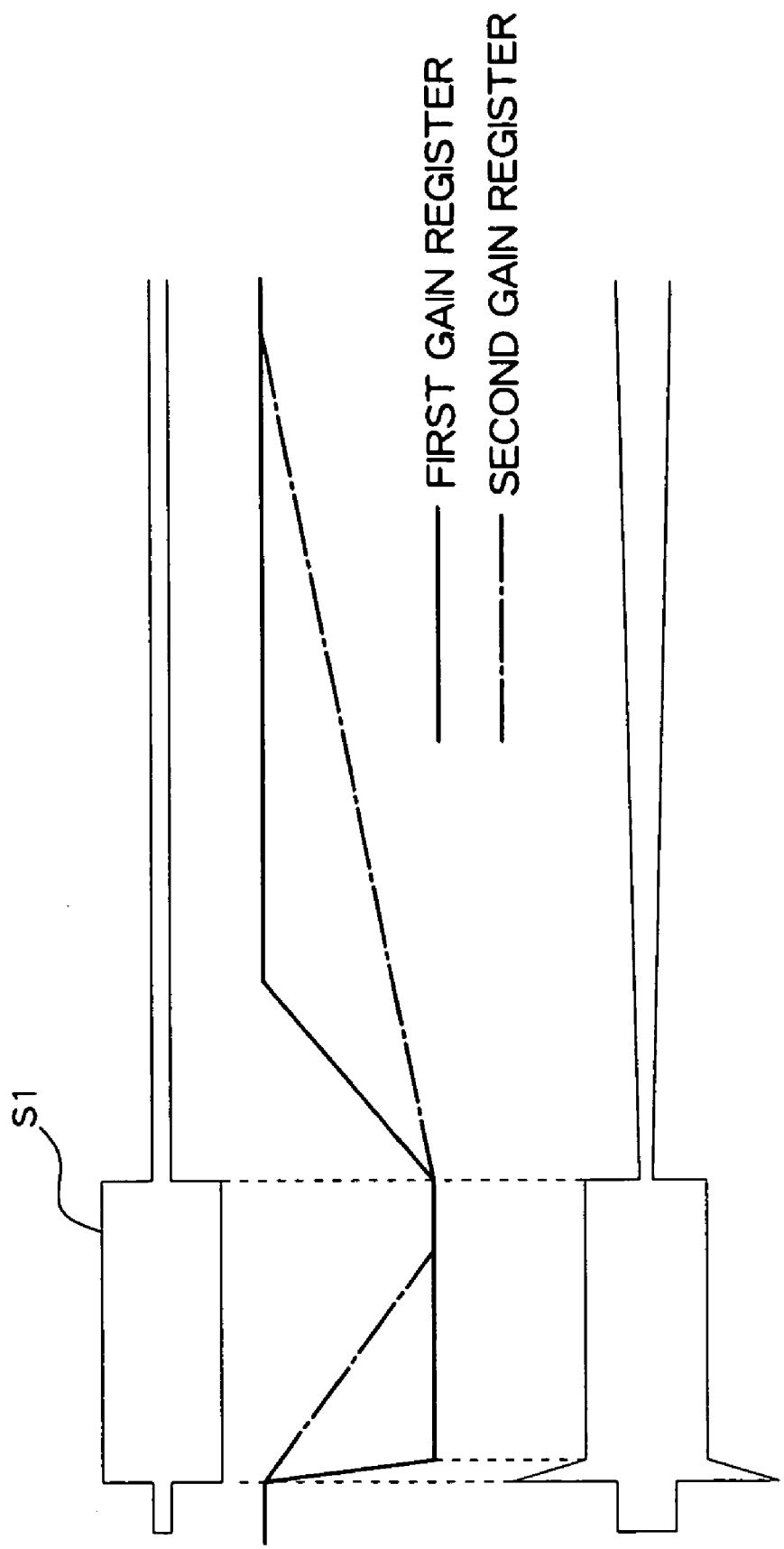
FIG. 3 is a diagram showing transitions of an input signal level and gain values in gain registers during a recovery action invoked after a large signal continues for a long time in the automatic level control circuit according to the first embodiment of the present invention, and showing a state of a signal level varying in the attack and recovery actions.
Figure 4:
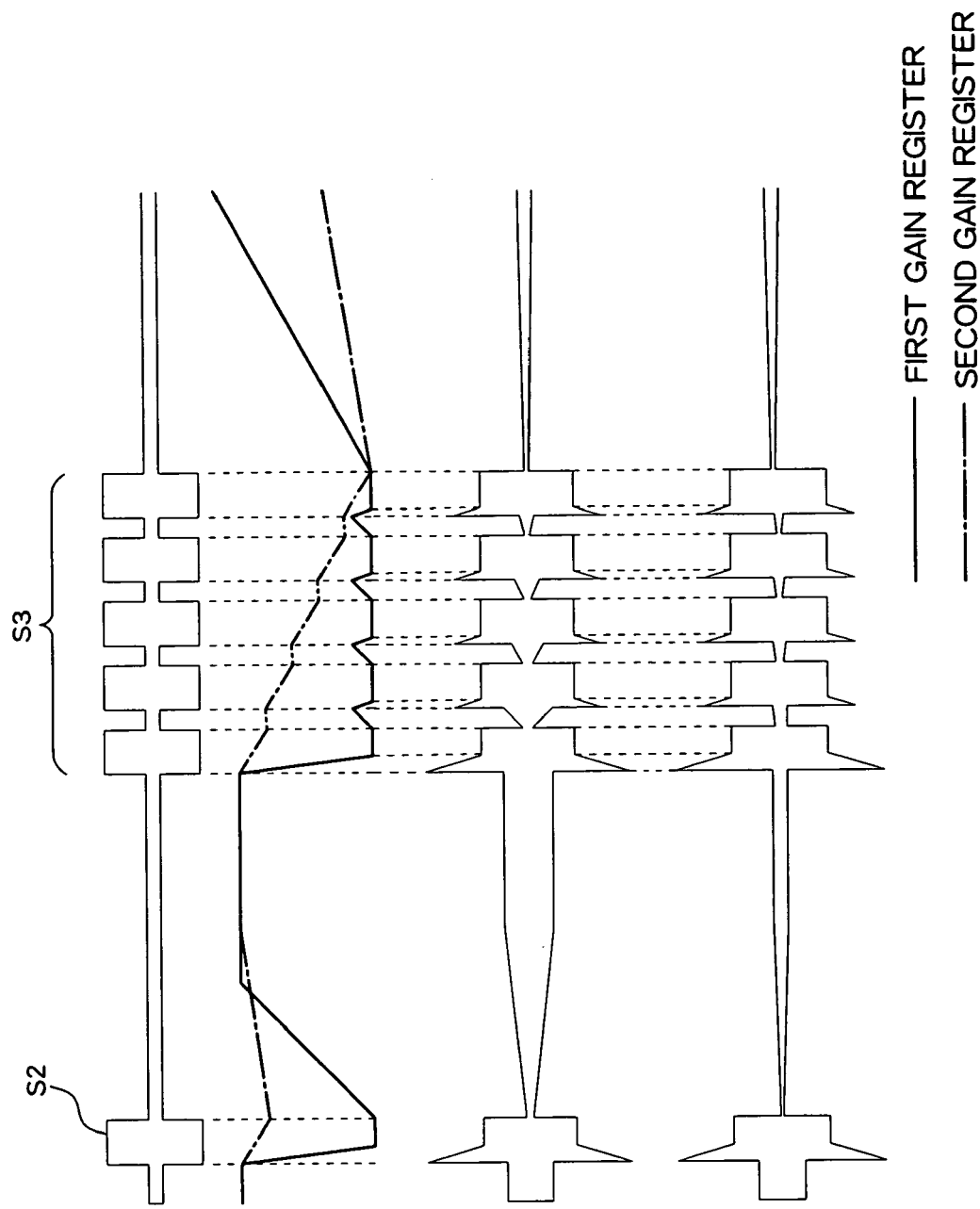
FIG. 4 is a diagram showing transitions of an input signal level and gain values in gain registers during a recovery action invoked after the occurrence of a short-duration large signal in the automatic level control circuit according to the first embodiment of the present invention, and showing states of a signal level varying in the attack and recovery actions and a signal level varying in conventional attack and recovery actions.

An automatic level control circuit according to the first embodiment has a configuration basically the same as that schematically shown in FIG. 1. FIG. 2 is a schematic diagram showing a configuration of a level detector 30 and a gain controller 40 in the automatic level control circuit according to the present embodiment. FIG. 3 is a diagram showing a recovery action invoked after a large signal continues for a long time in the automatic level control circuit according to this embodiment, and, in FIG. 3, an upper portion shows transitions of an input signal level and gain values in gain registers, and a lower portion shows a state of a signal level varying in the attack and recovery actions performed by the automatic level control circuit according to this embodiment. FIG. 4 is a diagram showing a recovery action invoked after the occurrence of a short-duration large signal, and, in FIG. 4, an upper portion shows transitions of an input signal level and gain values in gain registers, a middle portion shows a state of a signal level varying in the attack and recovery actions performed by the automatic level control circuit according to this embodiment, and a lower portion shows a signal level varying in conventional attack and recovery actions.

In the automatic level control circuit of FIG. 1, an A/D converter 20 is connected in a stage after a variable gain amplifier (for example, a programmable gain amplifier) 10. The A/D converter 20 converts an input audio signal (an analog signal) which has been amplified in the programmable gain amplifier 10 into a digital signal and outputs the resultant digital signal to a level detector 30.

The level detector 30 detects the magnitude of the digital signal (an output level of the programmable gain amplifier 10) and compares the detected level with predetermined reference levels (a relatively greater attack detection reference level and a relatively smaller recovery detection reference level). Then, from an obtained comparison result, a detection result indicating a one-step reduction of the gain of the programmable gain amplifier 10 (initiation of the attack action) or indicating a one-step increase of the gain (initiation of the recovery action) is obtained, as conventionally achieved in the related art. Based on the obtained detection result, a control signal to adjust the gain of the programmable gain amplifier 10 such that the output audio signal from the programmable gain amplifier 10 is set at a predetermined audio signal level is output from the gain controller 40. Thus, according to the gain adjustment control signal from the gain controller 40, the gain of the programmable gain amplifier 10 is established. In this manner, automatic adjustments to the gain of the programmable gain amplifier 10 are completed.

In this embodiment, the gain controller 40 includes gain resistors (consisting of a first gain register 41 and a second gain register 42) for storing two candidate signals each having a different attack/recovery time constant, and a selector 43 for selectively outputting one of output signals (candidate signals) which is obtained from either one of the gain registers 41 and 42. Control signals are output from the gain registers 41 and 42 based on the detection result obtained from the level detector 30 as described below, and then one of the candidate signals selected by the selector 43 is output as a control signal from the selector 43. Through the selection of the control signal in the selector 43, the recovery action invoked after the short-duration large signal can be performed at a recovery speed different from that of the recovery action invoked after other signals (including a signal composed of successive short-duration large signals). The circuit configuration and action of the gain controller 40 which operates based on the detection result obtained from the level detector 30 will be described in accordance with FIG. 2.

In this embodiment, the first gain register 41 in the gain controller 40 is configured to perform the attack action at high speed and perform the recovery action at medium speed. The second gain register 42, on the other hand, is configured to gradually increase the gain at low speed in the recovery action, reduce the gain basically at medium speed in an action other than the recovery action, and stop the change in gain at the time when a value of the gain becomes equal to the value of the first gain register 41.

In the specific configuration, when a detection signal (an attack detection signal) which indicates initiation of the attack action is input from the level detector 30 to the gain controller 40, KA1 is subtracted from a value in the first gain register 41 at the timing according to a sampling clock signal. The KA1 denotes that the gain is reduced by an amount equivalent to KA1 steps once in every one sampling clock period. For example, KA1 prestored in a register is read out according to the sampling clock and subtracted from the value stored in the first gain register 41, thereby updating memory contents in the first gain register 41.

In this manner, the candidate signal which provides an instruction for reducing the amplifier gain by the amount equivalent to the KA1 steps once in every one sampling clock period is repeatedly output from the first gain register 41 in succession for the duration of time that the attack detection signal is being sensed. Consequently, the amount totally subtracted at the timing of the sampling clock signal increases as the duration of time that the attack detection signal is being sensed becomes longer. Here, the attack action is set at high speed in the first gain register 41 in this embodiment, which means that the value of KA1 is specified as a greater value.

On the other hand, when a detection signal (a recovery detection signal) which instructs initiation of the recovery action is input from the level detector 30 to the gain controller 40, KR1 is added to the value in the first gain register 41 at the timing of the sampling clock signal. The KR1 denotes that the gain is increased by an amount equivalent to KR1 steps once in every one sampling clock period. For example, KR1 prestored in a register is read out according, to the sampling clock and added to the value stored in the first gain register 41, thereby updating the memory contents in the first gain register 41. In this manner, the candidate signal which provides an instruction for increasing the amplifier gain by the amount equivalent to the KR1 steps once in every one sampling clock period is repeatedly output from the first gain register 41 for the duration of time that the recovery detection signal is detected.

Further, when the detection signal (a recovery detected signal) which instructs initiation of the recovery action is input from the level detector 30 to the gain controller 40, KR2 is added to a value in the second gain register 42 at the timing of the sampling clock signal simultaneously with the addition to the first gain register 41. The KR2 denotes that the gain is increased by an amount equivalent to KR2 steps once in every one sampling clock period. In this manner, the candidate signal which provides an instruction for increasing the amplifier gain by the amount equivalent to the KR2 steps once in every one sampling clock period is repeatedly output from the second gain register 42 for the duration of time that the attack detection signal is detected.

In this embodiment, the first gain register 41 is configured to perform the recovery action at medium speed, while the second gain register 42 is configured to perform the recovery action at low speed. Accordingly, values of KR1 and KR2 are specified so as to satisfy a relationship of KR2<KR1. It is preferable that these values are specified so as to have a significant difference between them (i.e. KR2<<KR1).

During the interval that recovery detection does not occur (including the duration of time that the attack detection occurs), KA2 is subtracted from the value in the second gain register 42 using a NOT circuit at the timing of the sampling clock signal. In other words, while sensing no recovery detection, the operation of subtracting KA2 from the value of the second gain register 42 at every sampling clock period is enabled. Further, when the gain value of the second gain register 42 becomes equal to the value in the first gain register 41 as a result of the operation of subtracting KA2 during the interval that recovery detection does not occur, the subtracting operation performed in the second gain register 42 is terminated. In this embodiment, for example, the value of (a signal from) the first gain register 41 is input in a negative input terminal of the comparator 44, while the value of (a signal from) the second gain register 42 is input in a positive input terminal of the comparator 44, to establish the setting that terminates the above-described subtracting operation when the output signal from the comparator 44 becomes zero (or negative). In other words, the operation of subtracting KA2 from the value in the second gain register 42 at every sampling clock period is disabled even through the recovery detection does not occur. Because it is necessary to quickly reduce the gain at the occurrence of the attack detection regardless as to whether the signal is a short-duration large signal or a long-duration large signal, the values of KA1 and KA2 are assigned so as to fulfill the relationship of KA2<KA1. However, the values are not limited to those satisfying the relationship of KA2<KR1.

After finishing the above-described subtracting or addition operation during attack or recovery detection, the selector 43 selects the smaller candidate signal from among the candidate signals output from the gain registers 41 and 42 to change the gain, and output the smaller of the candidate signals as a control signal to the programmable gain amplifier 10. In other words, the smaller of the candidate signals is adopted as the gain. The selector 43 may have the structure including a comparator used for comparing values of the candidate signals from the first gain register 41 and the second gain register 42 in addition to a gate which opens for either one of the candidate signals from the first and second gain registers 41 and 42 based on the comparison result obtained from the comparator. When the candidate signals from the first and second gain registers 41 and 42 have the same value, either of the candidate signals may be selected.

Through the use of the gain controller 40 configured as described above, the recovery action initiated after the short-duration large signal can be performed at a recovery speed different from that of the recovery action initiated after the other signals (including a signal composed of successive short-duration large signals), which will be described in detail below.

Because the attack detection occurs when a long-duration large signal S1 shown in FIG. 3 is input, at the time immediately following the input, the first gain register 41 outputs the signal which provides the instruction for reducing the gain by the amount equivalent to the KA1 steps once in every sampling clock period, and the second gain register 42 outputs the signal to provides the instruction for reducing the gain by the amount equivalent to the KA2 steps once in every sampling clock period. Then, according to the relationship of KA2<KA1, the selector 43 selects the smaller gain, i.e. the signal from the first gain register 41 is selected. Consequently, the attack action at high speed is performed at the time immediately following the input.

Next, upon completion of input of the long-duration large signal S1, the recovery detection occurs, which initiates the recovery action to restore the original level. As described above, in the recovery action, the first gain register 41 outputs the signal to provide the instruction for increasing the gain by the amount equivalent to the KR1 steps in each sampling clock period, and the second gain register 42 outputs the signal to provide the instruction for increasing the gain by the amount equivalent to the KR2 steps in each sampling clock period. Then, taking into account a situation where the gain values from both the first and second gain registers 41 and 42 match with each other and KR2 is less than KR1, the smaller gain value, i.e. the signal from the second gain register 42 is selected in the selector 43. Therefore, after the input of the long-duration large signal S1 is completed, the recovery action is performed at low speed, in a manner similar to a conventional recovery action.

Further, when a short-duration large signal S2 as shown in FIG. 4 is input, the attack detection also occurs at the time immediately following the input, which triggers, as described above, the first gain register 41 to output the signal which provides the instruction for reducing the gain by the amount equivalent to the KA1 steps in each sampling clock period, and triggers the second gain register 42 to output the signal which provides the instruction for reducing the gain by the amount equivalent to the KA2 steps in each sampling clock period. Then, from the relationship of KA2<KA1, the smaller gain value, i.e. the signal from the first gain register 41 is selected in the selector 43. Accordingly, at the time immediately after the input, the attack action is performed at high speed.

When the input of the short-duration large signal S2 is completed, the recovery detection occurs, which triggers the recovery action to restore the original level as described above. In the recovery action, the first gain register 41 outputs the signal which provides the instruction for increasing the gain by the amount equivalent to the KR1 steps in each sampling clock period, and the second gain register 42 outputs the signal which provides the instruction for increasing the gain by the amount equivalent to the KR2 steps in each sampling clock period. Here, the attack actions are performed at different speeds in the gain registers 41 and 42, which causes the gain value obtained from the first gain register 41 to be smaller than the gain value obtained from the second gain register 42 at the time when the recovery action is initiated. Because, based on this situation and the relationship that KR2 is smaller than KR1, the smaller gain value, i.e. the signal from the first gain register 41 is selected in the selector 43, the recovery action is performed at medium speed (faster than the speed of the conventional recovery action) after the input of the short-duration large signal S2 is completed.

Further, in the attack detection occurring when the short-duration large signal shown in FIG. 4 (a series of short-duration large signals S3) is repeatedly input, similarly to the above-described signals, immediately following the first input of the series of short-duration large signals S3, the signal from the first gain register 41 is selected, thereby initiating the attack action at high speed.

Then, the recovery detection occurs after the attack action is completed, which triggers the recovery action to restore the original level. In this recovery action, similarly to the above-described short-duration large signal S2, the signal from the first gain register 41 is selected, thereby initiating the recovery action at medium speed (faster than the speed of the conventional recovery action). Because, in this example of the series of short-duration large signals S3, a new short-duration large signal is input at some point in the course of the recovery action having been performed at medium speed, the recovery action at medium speed is switched to the attack action at that point. Then, at the start of the subsequent recovery action, the gain value in the first gain register 41 is smaller than that in the second register 42. Based on this difference in value and on the relationship of KR2<KR1, the smaller gain value, i.e. the signal from the first gain register 41 is selected in the selector 43, thereby initiating the subsequent recovery action at medium speed (faster than the speed of the conventional recovery action).

In this manner, when the series of short-duration large signals S3 is input, the high-speed attack action and the medium-speed recovery action performed by the first gain register 41 are alternately repeated. Then, after the last input of the series of short-duration large signals S3 is completed, if a state where both of the gain values of the gain registers 41 and 42 match each other is realized as depicted in FIG. 4, for example, the smaller gain value, i.e. the signal from the second gain register 42 is selected based on the relationship that KR2 is smaller than KR1, thereby initiating the recovery action at low speed. Thus, when the series of short-duration large signals S3 is input, the recovery action at low speed similar to the conventional recovery action is invoked assuming that the long-duration large signal S1 is input.

Figure 5:
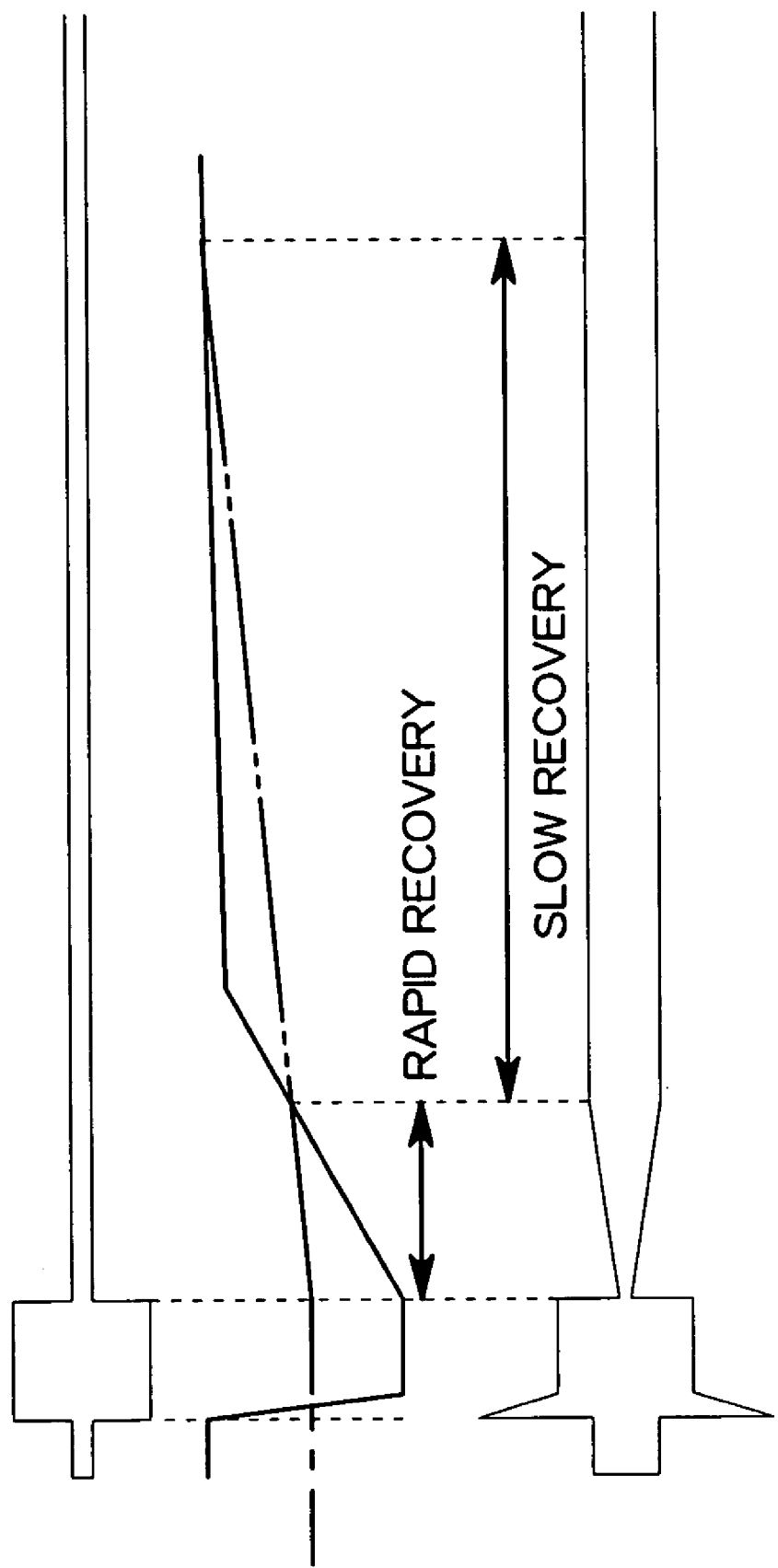
FIG. 5 is a diagram showing transitions of an input signal level and gain values in gain registers during a recovery action invoked after the occurrence of a medium-duration large signal in the automatic level control circuit according to the first embodiment of the present invention, and showing a state of a signal level varying in the attack and recovery actions.

Because, in the case of a medium-duration large signal, of a duration between short and long, the recovery action starts before the gain value of the second gain register 42 is reduced to a value equal to the gain value of the first gain register 41 in this embodiment, the signal from the first gain register 41 is selected for the recovery gain. Therefore, the recovery action is performed at a speed faster than that of the conventional recovery action. Then, the recovery action according to the signal from the first gain register 41 continues in a state where the gain value of the first gain register 41 follows that of the second gain register 42 as shown in FIG. 5. After the gain value of the first register 41 reaches the other gain value, the signal from the first gain register 41 is switched to the signal from the second gain register 42 which provides slower recovery, thereby initiating the recovery action according to the signal from the second gain register 42.

As described above, after the medium-duration large signal, the recovery action at medium speed is initially performed, and then the recovery action at low speed is subsequently performed from some midpoint in the course. In such a case of the medium-duration large signal, the time when the gain value of the first gain register 41 reaches the gain value of the second gain register 42 varies depending on the length of a time interval during which the large signal continues. Accordingly, the time required for recovery after the medium-duration large signal varies in accordance with the length of the time interval of the large signal.

As described above, through the use of the automatic level control circuit according to this embodiment, the smaller of the gain values from the two gain registers (the first gain register 41 and the second gain register 42) each having a different attack/recovery time constant is selected to control the recovery action, thereby enabling the recovery action at medium speed (i.e. a faster recovery action as compared with the conventional recovery action) after the short-duration large signal. In this manner, the amplifier gain rapidly reduced by the attack action due to the short-duration large signal can be swiftly restored to the original gain, which provides a solution to the problematic situation in which the condition of the insufficient sound level is maintained over a certain period of time until the rapidly reduced amplifier gain recovers to its original state through the recovery action.

Further, by selecting the smaller of the gain values from the two gain registers having different attack/recovery time constants to control the recovery action, repeated inputs of successive short-duration large signals are regarded as being processed in the same manner with the input of the large signal continuing for a long duration, thereby initiating the slow recovery action similarly to the conventional case. In this manner, when, for example, the sound of a drum (a short-duration large signal) continues intermittently over a long period time, the rapid increase of the amplifier in a short time is avoided, in spite of the fact that the signal is the short-duration large signal, thereby protecting data on sound intensity from being lost, which enables automatic control of level while maintaining an audio quality.

On the other hand, in the case of the medium-duration large signal, the medium-speed recovery action (which is faster than the conventional recovery action) is initially performed, and then the slow recovery action is started from some point in the course of recovery. The time required for recovery thus varies according to the length of the interval that the medium-duration large signal continues as described above. Therefore, the automatic control of the level is achieved in accordance with the length of the interval that the medium-duration large signal continues while maintaining the audio quality without losing the data on sound intensity in addition to attempting to minimize the recovery time.

Although KA1, KA2, KR1, and KR2 in the above-described embodiment represent the number of steps in which the gain is changed in each sampling clock period, KA1, KA2, KR1, and KR2 are not limited to the number of steps, and any values which indicate the speed of changing the gain in the attack and recovery actions may be adopted as KA1, KA2, KR1, and KR2.

While an example illustrating an embodiment of the present invention has been described above, it is to be understood that the example is illustrative and not restrictive, and that any circuit configuration capable of realizing the technical concept of the present invention that, by selecting the smaller gain values from the two gain registers having different attack/recovery time coefficients, the attack/recovery action is controlled at different speeds may be adopted.

In addition, although the automatic level control circuit according to this embodiment has the structure in which the analog output from the programmable gain amplifier 10 is converted into a digital output for level detection, and is provided to the stages after the programmable gain amplifier 10, the circuit configuration of the automatic level control circuit is not limited to the structure. For example, the analog output may be supplied from the programmable gain amplifier 10 only to the A/D converter 20, and the digital signal converted from the analog signal in the A/D converter 20 may be output from the A/D converter 20 to the level detector 30 and may be supplied to the stages after the A/D converter 20.

Figure 6:
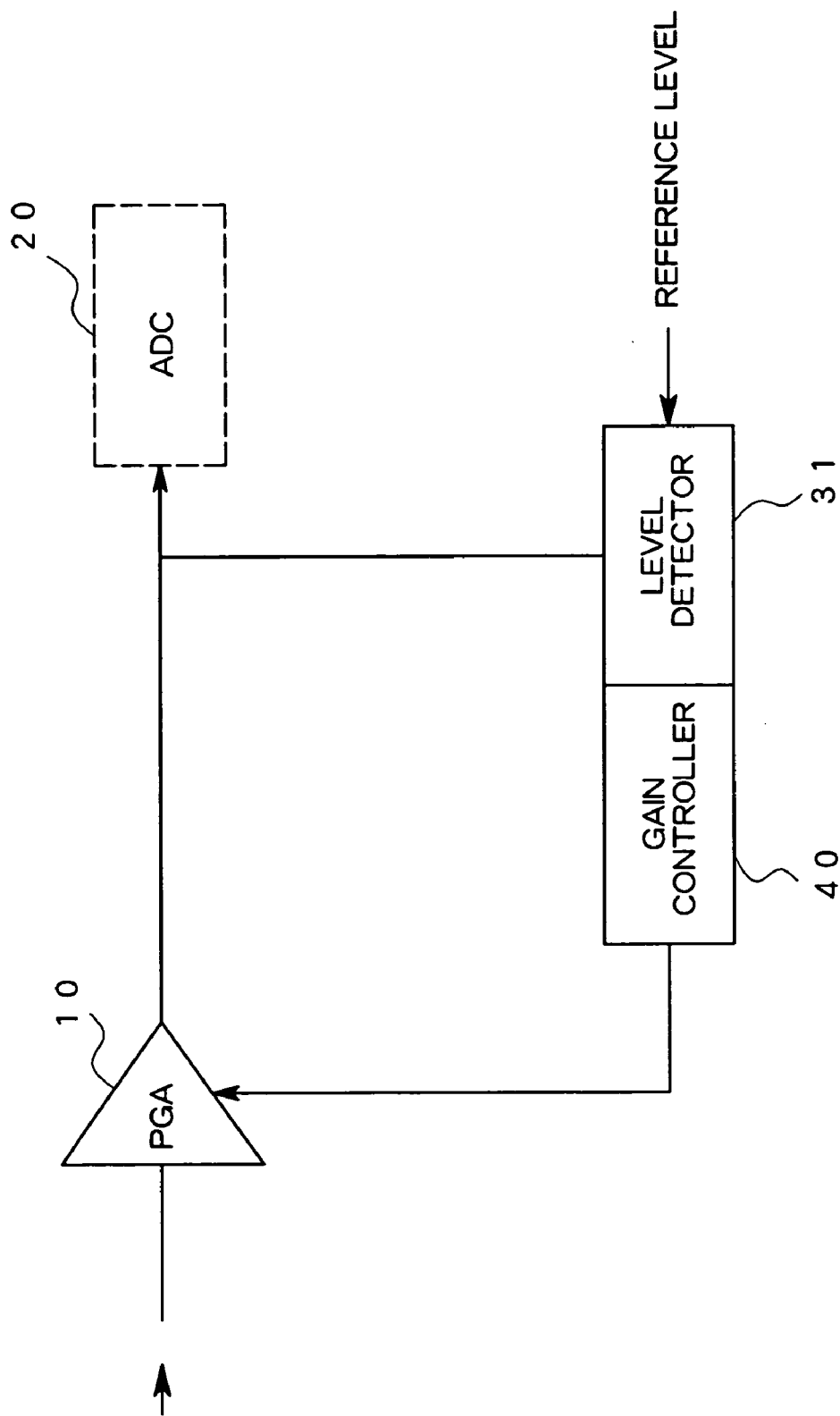
FIG. 6 is a schematic diagram showing a configuration of an automatic level control circuit in a digital detection system using a programmable gain amplifier according to a second embodiment of the present invention.

Further additionally, as shown in FIG. 6, for example, an automatic level control circuit in which an analog signal from the programmable gain amplifier 10 is input in the level detector 31 can also produce effects similar to those obtained by the automatic level control circuit according to the above-described embodiment.

Figure 7:
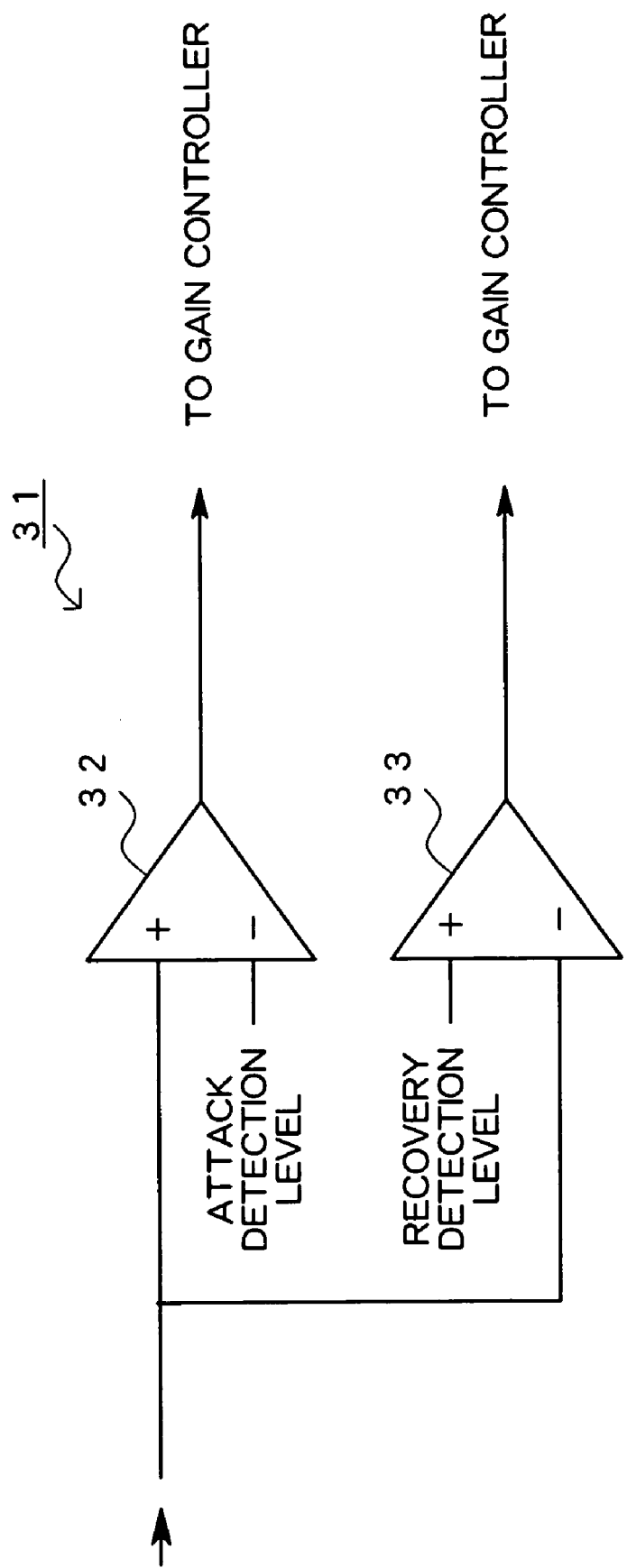
FIG. 7 shows an example of a circuit configuration of a level detector in the automatic level control circuit of FIG. 6.

FIG. 6 shows a configuration of the automatic level control circuit in a digital detection system using a programmable gain amplifier according to a second embodiment of the present invention. In the automatic level control circuit of FIG. 6, an analog voltage level of an analog signal to be input is compared with a predetermined reference voltage level in the level detector 31 in which a first voltage comparator 32 and a second voltage comparator 33 are installed as shown in FIG. 7, for example. The first voltage comparator 32 compares the input analog voltage level with a predetermined reference voltage level (attack detection level), and, when the level of the input signal is higher than the attack detection level, outputs a signal of a comparison result (an attack detection signal) to the gain controller 40 provided in the subsequent stage. The second voltage comparator 33, on the other hand, compares the level of the input signal with a predetermined reference voltage level (a recovery detection level), and, when the level of the input signal is lower than the recovery detection level, outputs a signal of the comparison result (a recovery detection signal) to the controller 40 provided in the subsequent stage. Then, similarly as in the previous embodiment, based on the obtained signal of the comparison results, a control signal to adjust the gain of the programmable gain amplifier 10 such that the output audio signal from the programmable gain amplifier 10 is established at a predetermined audio signal level is output from the gain controller 40.

By configuring the level detector 31 as described above, the automatic level control circuit in which the analog signal from the programmable gain amplifier 10 is input in the level detector 31 can produce the same effects as those obtained by the automatic level control circuit according to the first embodiment.

Having been described above, according to the present invention, the recovery action invoked after the input of an isolated short-duration large signal enables quick recovery to the original gain even when the amplifier gain is rapidly reduced in the attack action invoked by the isolated large signal. It is therefore possible to avoid a problematic situation in which the condition of the insufficient sound level is maintained over a long time period until the steeply reduced amplifier gain is restored to its original state by the recovery action. On the other hand, the repeated successive inputs of the short-duration large signal are interpreted as the input of the large signal continuing for a long time, and the recovery action is performed at low speed, as in the related art. Therefore, because, when the short-duration large signal is repeatedly input over a relatively long period of time, the amplifier gain is not steeply increased in a short time in contrast to a case where a single short-time large signal is input, the data on sound intensity is protected from being lost, thereby enabling automatic control of level while maintaining the audio quality. Further, in the case of the medium-duration large signal, because the time required for completing the recovery action varies according to the length of time that the medium-duration large signal continues, it is possible that, in addition to enabling the automatic control of level while maintaining the audio quality without loss of sound intensity data in accordance with the length of time that the medium-duration large signal continues, the recovery time may be minimized.

What is claimed is:

1. An automatic level control circuit comprising:
   a level detection circuit which detects a level of an output signal from a variable gain amplifier for attack detection to sense a detected level greater than or equal to a predetermined level and for recovery detection to sense a detected level smaller than or equal to the predetermined level, and
   a gain control circuit which outputs, based on a detection result obtained by the level detection circuit, a gain adjustment control signal to regulate a gain of the variable gain amplifier such that the output signal from the variable gain amplifier is set to a predetermined signal level; wherein
   the gain control circuit generates a plurality of candidate signals to change the gain at different response speeds, and selectively outputs, as the gain adjustment control signal, one of the candidate signals which provides a smallest value as the gain.

2. The automatic level control circuit according to claim 1, wherein the gain control circuit further comprises:
   two gain registers each individually storing one of the candidate signals which sequentially varies at a response speed different from that of the other candidate signals, and
   a selector for selecting one of the candidate signals which provides the smallest value as the gain and then outputting the selected one of the candidate signals as the gain adjustment control signal.

3. The automatic level control circuit according to claim 2, wherein
   when the attack detection occurs in the level detection circuit, the gain control circuit sequentially subtracts setting values which are different between the two gain registers and stored in their respective gain registers from values of the two gain registers individually, and
   when the recovery detection occurs in the level detection circuit, the gain control circuit sequentially adds the setting values which are different between the two registers and prestored in their respective gain registers from values of the two gain registers individually.

4. The automatic level control circuit according to claim 3, wherein, when the attack detection occurs in the level detection circuit, one of the candidate signals capable of providing a smaller gain is selected to enable a rapid reduction of the gain after input of a large signal.

5. The automatic level control circuit according to claim 3, wherein:
the two gain registers consists of a first gain register and a second gain register, the first gain register storing a candidate signal which yields a faster change of the gain than that achieved in the second gain register at both times when the attack detection occurs and times when the recovery detection occurs, and
the candidate signal stored in the first gain register is selected for an isolated input of a short-duration large signal, to thereby enable a rapid reduction of the gain when the attack detection occurs and enable a rapid increase of the gain when the recovery detection subsequent to the attack detection occurs.

6. The automatic level control circuit according to claim 4, wherein:
the two gain registers consists of a first gain register and a second gain register, the first gain register storing a candidate signal which yields a faster change of the gain than that achieved in the second gain register at both times when the attack detection occurs and times when the recovery detection occurs; and
the candidate signal stored in the first gain register is selected for an isolated input of a short-duration large signal, to thereby enable a rapid reduction of the gain when the attack detection occurs and enable a rapid increase of the gain when the recovery detection subsequent to the attack detection occurs.

7. The automatic level control circuit according to claim 3, wherein:
the two gain registers consist of a first gain register and a second gain register, a candidate signal in the first gain register yields a faster change of the gain than that achieved in the second gain register at both times when the attack detection occurs and times when the recovery detection occurs is stored, and the change of the gain of the candidate signal generated when the attack detection occurs is greater than that of the candidate signal generated when the recovery detection occurs; and
when the short-duration large signal is repeatedly input in a short cycle, the first gain register is selected to set the gain to a low value, and, after the input of the short-duration large signal is completed, the second gain register is selected to increase the gain at a relatively slow transition speed.

8. The automatic level control circuit according to claim 4, wherein:
the two gain registers consists of a first gain register and a second gain register, a candidate signal in the first gain register yields a faster change of the gain than that achieved in the second gain register at both times when the attack detection occurs and times when the recovery detection occurs is stored, and the change of the gain of the candidate signal generated when the attack detection occurs is greater than that of the candidate signal generated when the recovery detection occurs; and
when the short-duration large signal is repeatedly input in a short cycle, the first gain register is selected to set the gain to a low value, and, after the input of the short-duration large signal is completed, the second gain register is selected to increase the gain at a relatively slow transition speed.

9. The automatic level control circuit according to claim 3, wherein:
the two gain registers consist of a first gain register and a second gain register, a candidate signal in the first gain register yields a faster change of the gain than that achieved in the second gain register at both times when the attack detection occurs and times when the recovery detection occurs is stored, and the change of the gain of the candidate signal generated when the attack detection occurs is greater than that of the candidate signal generated when the recovery detection occurs; and
when a medium-duration large signal is input, the first gain register is selected to quickly reduce the gain, and, after the input of the medium-duration large signal is completed, the first gain register is again selected and then the second gain register is subsequently selected to increase the gain at an appropriate speed.

10. The automatic level control circuit according to claim 4, wherein:
the two gain registers consists of a first gain register and a second gain register, a candidate signal in the first gain register yields a faster change of the gain than that achieved in the second gain register at both times when the attack detection occurs and times when the recovery detection occurs is stored, and the change of the gain of the candidate signal generated when the attack detection occurs is greater than that of the candidate signal generated when the recovery detection occurs; and
when a medium-duration large signal is input, the first gain register is selected to quickly reduce the gain, and, after the input of the medium-duration large signal is completed, the first gain register is again selected and then the second gain register is subsequently selected to increase the gain at an appropriate speed.

* * * * *